(12) United States Patent
Holman

(10) Patent No.: US 6,622,268 B2
(45) Date of Patent: Sep. 16, 2003

(54) METHOD AND APPARATUS FOR PROPAGATING ERROR STATUS OVER AN ECC PROTECTED CHANNEL

(75) Inventor: Thomas J. Holman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 457 days.

(21) Appl. No.: 09/725,221

(22) Filed: Nov. 29, 2000

(65) Prior Publication Data

US 2002/0138803 A1 Sep. 26, 2002

(51) Int. Cl.[7] .............................................. H03M 13/03
(52) U.S. Cl. .................... 714/701; 714/52; 714/753; 714/765; 714/785
(58) Field of Search .................. 714/50, 701, 703–704, 714/708, 753, 765, 785

(56) References Cited

U.S. PATENT DOCUMENTS 5,291,496 A * 3/1994 Andaleon et al. ........... 714/703
5,856,987 A * 1/1999 Holman ...................... 714/785
6,101,614 A * 8/2000 Gonzales et al. ........... 714/764
6,490,703 B1 * 12/2002 de la Iglesia et al. ...... 711/103

FOREIGN PATENT DOCUMENTS

JP          60064529 A  *  4/1985  .......... H03M/13/00

* cited by examiner

*Primary Examiner*—R. Stephen Dildine
(74) *Attorney, Agent, or Firm*—Jeffrey B. Huter

(57) ABSTRACT

System and methods for propagating error status over an error checking and correcting (ECC) protected channel. A first device receives data and an error status associated with the data. The first device generates check bits for the data based on a first ECC code and combines the check bits with the data to form one or more code words. The first device sends the code words across the channel where the first device inserts a triple error into a nibble of at least one codeword sent if the error status indicated an uncorrectable error. A second device connected to the channel receives the code words sent across the channel. The second device detects triple errors within a nibble of any code word and any other single error in the code word using a second ECC code, where the second ECC code is the first ECC code with columns for check bits inserted.

29 Claims, 2 Drawing Sheets

METHOD AND APPARATUS FOR PROPAGATING ERROR STATUS OVER AN ECC PROTECTED CHANNEL

BACKGROUND

1. Field

This invention relates to data error reporting, and more specifically to propagating error status over an error checking and correcting (ECC) channel.

2. Background

Frequently, data that is read out of electronic devices, such as storage devices, input/output devices, etc., have parity bits or other types of check bits associated with the data. The check bits notify a receiver of the data whether the data being received is good data or whether the data has errors. If the data read from a memory or other source is to be received by one device and then sent to another device, the second receiving device needs to be aware that the data read (e.g., from a memory), is bad and has errors. However, if the error checking and correcting (ECC) that was used for the data in memory is different from the ECC used on the channel to send the data to the second receiving device, a different ECC code may need to be generated for the data that is read out of memory before sending the data to the second receiving device across the channel. Therefore, if data read from a memory or other device is corrupted (i.e., the data from memory has an uncorrectable error), the device receiving the data may compute new check bits with different ECC that is used on the channel, and send the data and new check bits to the second receiving device. At the second receiving device, everything looks fine regarding the validity of the data (since new check bits were generated), but this device may have actually received corrupted data. Therefore, the second receiving device needs to be notified that the data being received is corrupted and has an uncorrectable error.

One way to notify the second receiving device that the data being received has an uncorrectable error is to add an additional signal line to the second receiving device notifying this device when the data being received has an uncorrectable error. However, this requires the addition of another wire and possibly other hardware to the second receiving device. A second option is to purposely corrupt the data being sent to second receiving device again so that when the second receiving device receives the data it will detect an error. Since many channels and devices use single error correction (SEC) and double error detection (DED), injecting two errors into the data by the first receiving device before sending the data to the second receiving device will alert the second receiving device that the data has one or more uncorrectable errors. One way to inject two errors into the data is to flip two check bits before sending the data and check bits over the channel.

However, it is possible to get an additional error in the channel. If there is an error in the channel, this additional error may mask the injected errors, therefore, hiding the fact that the data contains an uncorrectable error. Therefore, a single bit error that occurs on the channel may alias the data to no error or to a single bit error, therefore, masking the uncorrectable error from the second receiving device. Since the first receiving device may be streaming data through the channel to the second receiving device, it is desired to insure that knowledge of uncorrectable errors get to the second receiving device.

Moreover, if the ECC code used at the second receiving device can only detect single and double bit errors, if four errors occur in the data sent across the channel, this may mask the fact that any error exists at all and the data may appear to have no errors to the second receiving device.

Therefore, a need exists for a more robust mechanism for propagating error status information over an ECC protected channel that is robust in the presence of single bit errors that may occur on the ECC protected channel.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments (e.g., servers).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention is related to system and methods for reporting error status information from one portion of a system to another over an error checking and correcting (ECC) protected channel. In systems and methods according to the present invention, additional signal wires are not required on the channel. An ECC code is used to transmit error status information by using specific properties of the ECC code. Systems and methods according to the present invention provide a more robust mechanism for propagating error status information over an ECC protected interface since it is robust in the presence of single bit errors on the ECC protected interface (i.e., channel).

Figure 1:
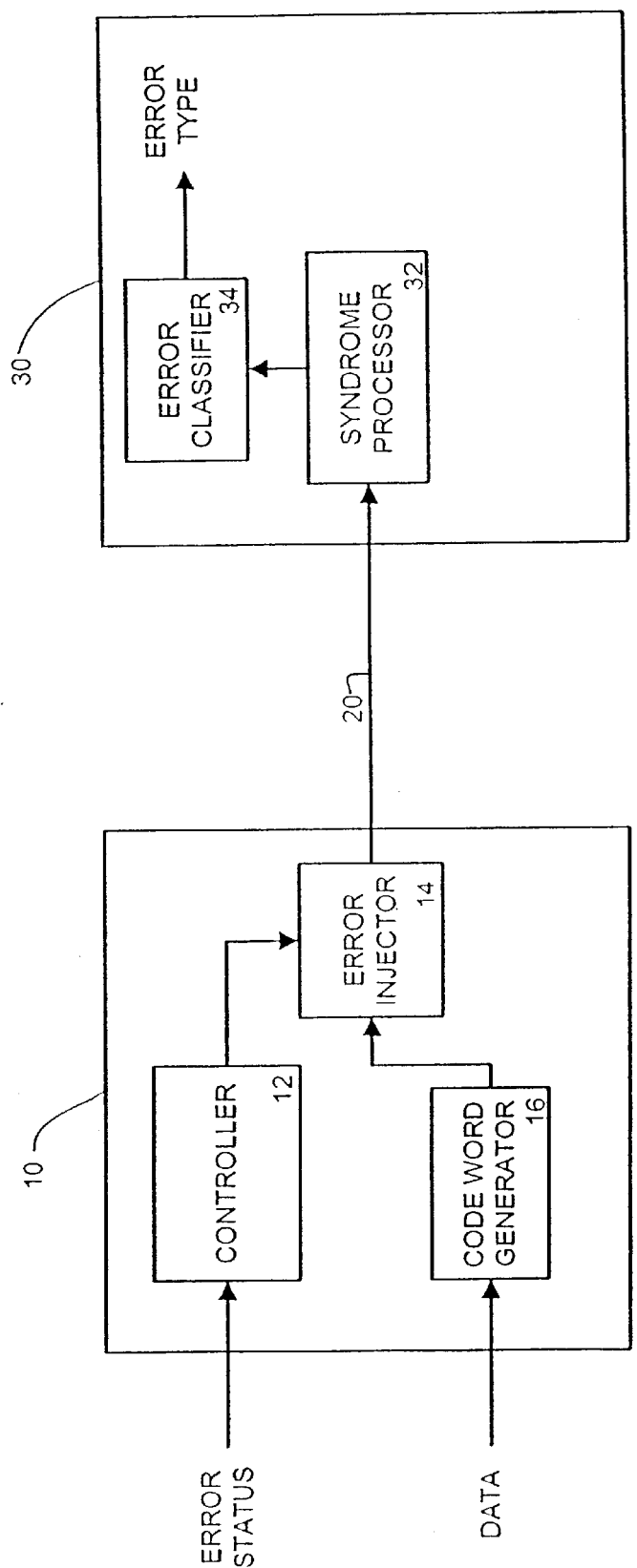
FIG. 1 is a block diagram of an example system for propagating error status over an ECC protected channel according to an example embodiment of the present invention.

FIG. 1 shows a block diagram of an example system for propagating error status over an ECC protected channel according to an example embodiment of the present invention. A first device 10 sends one or more code words, that includes data and check bits, across an ECC protected channel or interface 20 to a second device 30. First device 10 includes a controller 12, a code word generator 16, and an error injector circuit 14. Other devices and/or applications may also be present at first device 10 and still be within the spirit and scope of the present invention. A second device 30 includes a syndrome processor 32 and an error classifier circuit 34. Similarly, other devices may be present at second device 30 and still be within the spirit and scope of the present invention. Device 10 receives data at code word generator 16, and receives error status associated with the data at controller 12.

The incoming data may come from any of many different types of sources, e.g., a memory device, a processor, an I/O (input/output) device, etc. The error status coming into device 10 may come from error checking circuitry that has checked the data from the memory or other device, and produced an error status. This error status may be that the data has no error, that the data has a correctable error, or that the data has an uncorrectable error. If the data had a correctable error, the error may have been corrected by the error checking circuitry before being received by device 10. If the error status indicates that the incoming data has an uncorrectable error, then the incoming data into device 10 still has errors associated with it.

The ECC used in the memory or other device that sends the data and error status to device 10 is different than the ECC code used before transmitting the data across channel 20 to second device 30. Therefore, first device 10 receives the data and error status, and generates new check bits on the data before sending the data and check bits in the form of a code word across channel 20 to second device 30. Syndrome processor 32 receives the data and check bits, re-computes check bits on the data, generates a syndrome, and compares the check bits generated with the check bits received across channel 20. If an error that is uncorrectable is detected, device 30 handles the data accordingly and may generate an error type signal from error classifier 34. Error classifier 34 classifies errors as, for example, no error, correctable error, or uncorrectable error.

The data coming into code word generator 16 may consist of data words of any of many lengths, e.g., 16 bit data word, 32 bit data word, 64 bit data word, etc. Code word generator 16 receives the data and creates check bits for each data word. Controller 12 receives the error status and if the error status indicates an uncorrectable error, controller 12 controls error injector circuitry 14 to inject a triple-bit error into a four bit nibble of the code word before the code word is transmitted across channel 20. Syndrome processor 32 receives the code word with the triple bit error inserted in a nibble of the code word, and is therefore able to determine that the data being received has an uncorrectable error. Further, if a code word is sent with a triple-bit error inserted into a nibble of the code word, and channel 20 also injects an additional single-bit error into the code word (therefore producing four errors in the code word), the syndrome processor is still able to detect that the receive data has an uncorrectable error.

Code word generator 16 uses an ECC code to determine how to generate check bits on the received data. The ECC code may be in the form of a matrix. The number of columns in the matrix may be determined by the length of a data word of the data. The number of rows in the matrix may be determined by the number of check bits generated on the data. An additional column is inserted in the ECC code matrix for every check bit that will be generated on the data. This forms a second ECC code matrix which may be used at the receiving device 30 to generate syndrome bits to determine the validity of the received data.

Below is shown an example ECC code with the check bit positions inserted. This code is based on a 64 bit data word, however, other matrices may be used that are based on other data word sizes and still be within the spirit and scope of the present invention. Example data with 64 bit words will be used to illustrate the present invention. The check bit positions shown in the ECC code are in positions that provide the ECC code with single four bit nibble error detection (S4ED) capability. If the check bits are all at the end of the code, the ECC code would only have the capability of single error correction (SEC) and double error detection (DED).

Example ECC Code

```
1000100010001000100010000100000111000000000011110000111111111100011001001
0100010001000100010001000100001101000000111100001111000011111001100011000
0010001000100010001000100110001001001111000000001111111100001100110010000
0001000100010001000100011100001101101111111111100000000000010000100100000
0000000011110000111111110001100100110001000100010001000100001000001110000
0000111100001110000111110011000110001000100010001000100010001000011010000
1111000000001111111100001100110010000010001000100010001001100010001001000
1111111111100000000000100001001000000100010001000100010001110000110110
       cc      cc                                       cc      cc
```

To help the present invention, we will call the above ECC code (with the check bits included), the H-matrix and the ECC code without the check bits the G-matrix. If you remove the check columns the G-matrix, which is used to generate code words (i.e., at device 10). The H-matrix, is used at the receiver (i.e., device 30) to check for errors in the received code words. Of course device 10 and device 30 may use the same ECC code (H-matrix) to perform their functions. Device 10 knows where to place the check bits into the code words based on the ECC code (H-matrix).

A check bit is generated for each row of the matrix (i.e, a data word). Eight check bits will be used also for this purpose. The example ECC code shown above is a (72,64) SEC-DED-S4D code, i.e. The code length is 72 bits, the data lenght is 64 bits, and there are 8 check bits. Thus, since there are eight check bits in this example ECC code, there are eight rows in the ECC code. The check bit columns are denoted by a "c" at the bottom of the column, the other positions are data. A "1" in a check bit column denotes the check bit position for the particular row that the "1" resides in. For example, looking at the first check bit column, note that a "1" exists only in row three of this check bit column. This denotes that the check bit which is calculated on the data of row three is to be placed in this position. The number of check bits are selected based on a desired level of error detection and correction. This ECC code provides the property that triple errors within a nibble of a code word received plus any additional single error (i.e., injected by the channel) are detectable by a receiving side (e.g., device 30).

Code word generator 16 at device 10 receives the data and generates code words by first computing check bits on the data. The check bits are computed by taking the dot product of the G-matrix and the data. Each row of the G-matrix is used to generate a check bit, so there are 8 check bits. If $c[i]$=the ith check bit, $d[j]$=the jth data bit and $G[i][j]$ is the G-matrix where $G[0][0]$ is the upper left element, then:

$$c[i]=XOR(d[j] \text{ AND } G[i][j]) \text{ for } j=0 \text{ to } 63 \quad (1)$$

Since $(d[j] \text{ AND } G[i][j])=d[j]$ if $G[i][j]=1$, and 0 otherwise, the AND operation is not needed. Therefore, we may simply XOR the data bits for each j where $G[i][j]=1$. For example:

$$c[0]=d[0] \text{ XOR } d[4] \text{ XOR } d[8] \text{ XOR } d[12] \text{ XOR } d[16] \quad (2)$$

At device 30, code words are checked by computing a syndrome, S, at syndrome processor 32. The syndrome is the dot product of the incoming code word, "w", and the H-matrix.

$$S[i]=XOR (w[j] \text{ AND } H[i][j]) \text{ for } j=0 \text{ to } 72 \quad (3)$$

The syndrome is used by error classifier circuit 34 to classify errors. For this example ECC code:

if S=0==> no errors;
if S has odd weight:
   if the nibbles of S have weights 3 and 2==> then triple error within a nibble,
   else==> this is a correctable error;
if S has even weight (and is non-zero)==> then this is an uncorrectable error. The weight of a vector of 1's and 0's is the number of 1's in the vector.

In systems and methods according to the present invention, a triple error is injected within a nibble, for example in $d[0]$, $d[1]$, and $d[2]$. The above ECC code (i.e., H-matrix) would detect this error as uncorrectable. Also, the ECC code has the property that in the event of a single error in any position (including 0, 1, and 2), the resulting syndrome will be non-zero and even weight, hence, the error will be detected as an uncorrectable error.

Figure 2:
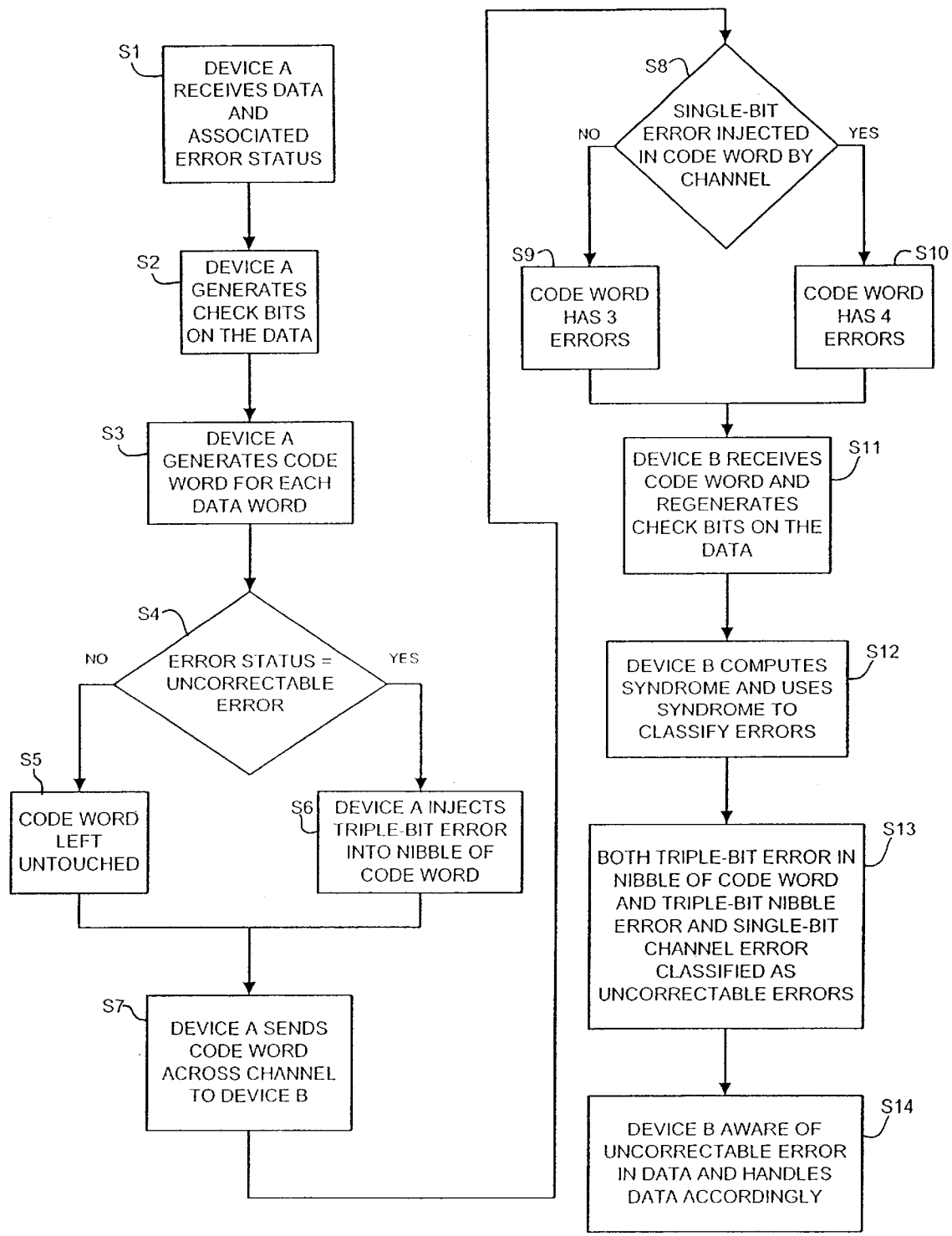
FIG. 2 is a flowchart of an example process for propagating error status over an ECC protected channel according to an example embodiment of the present invention.

FIG. 2 shows a flowchart of an example process for propagating error status over an ECC protected channel according to an example embodiment of the present invention. Device A receives data and an associated error status S1. Device A then uses an ECC code to generate check bits on the data S2. Device A generates a code word for each data word in the data received S3. The code word includes the data word and the generated check bits. A determination is made by device A as to whether the error status indicates that the received data has an uncorrectable error S4. If the error status indicates no error, or correctable error (indicating that the error has already been corrected in the data), the code word that has been generated is left untouched S5. However, if the error status indicates that the received data has an uncorrectable error, device A injects a triple-bit error into a nibble of the code word S6.

Device A sends the code word across the channel to device B, S7. By injecting a triple-bit error into a nibble of the code word, device A is transmitting the fact that the data has an uncorrectable error to the receiving device. A single-bit error may be injected into the code word by the channel due to noise on the channel or other factors S8. If the channel has not injected any errors into the code word, the code word will remain with three errors, if device A determined that the data had an uncorrectable error S9. If the data has an uncorrectable error, the code word will have a triple-bit error inserted in it. If the channel further injects an additional single bit error, the code word will now contain four errors S10.

Device B receives the code word and regenerates the check bits on the data using the ECC code S11. Device B computes a syndrome and uses the syndrome to classify any errors detected S12. By using the ECC code at device B, both triple-bit error in a nibble of the code word, and a triple-bit error in the nibble of the code word as well as a single bit error caused by the channel in the code word will both be classified as uncorrectable errors S13. Therefore, device B will have been made aware of an uncorrectable error in the data and will handle the data accordingly S14. A single error injected by the channel or any other source may occur anywhere in the code word and still be detected based on the ECC code.

Therefore, in systems and methods according to the present invention, a more robust mechanism is provided for propagating error status information over an ECC protected interface. Systems and methods according to the present invention are robust in the presence of single bit errors on the ECC protected interface. Therefore, systems and methods for propagating error status information over an ECC protected channel according to the present invention are more reliable and the cost to implement are negligible.

It is noted that the foregoing examples have been provided merely for the purpose of explanation and are in no way to be construed as limiting of the present invention. While the present invention has been described with reference to a preferred embodiment, it is understood that the words which have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A system for propagating error status over an error checking and correcting (ECC) protected channel comprising:

a first device, the first device receiving data and an error status associated with the data, the first device generating check bits for the data based on a first ECC code and combining the check bits with the data to form at least one codeword;

a channel operably connected to the first device, the first device sending the at least one codeword across the channel, the first device inserting a triple error into a nibble of one at least one codeword sent if the error status indicated an uncorrectable error; and a second device operably connected to the channel, the second device receiving the at least one codeword sent across the channel, the second device detecting triple errors within a nibble of the at least one codeword and any other single error in the at least one codeword using a second ECC code.

2. The system according to claim 1, wherein the other single error comprises an error introduced by the channel.

3. The system according to claim 1, wherein the first device includes a controller, the controller receiving the error status.

4. The system according to claim 1, wherein the first device includes a code generator, the code generator generating check bits for the data based on the first ECC code and combining the check bits with the data to form the at least one codeword.

5. The system according to claim 4, wherein the check bits are located in the at least one codeword to allow for single 4 bit nibble error detection (S4ED).

6. The system according to claim 1, wherein the second ECC code comprises the first ECC code with additional columns inserted denoting designated positions of check bits, the check bit positions providing for single 4 bit nibble error detection (S4ED).

7. The system according to claim 1, wherein a check bit is generated for each row of the first ECC code, the data comprising at least one data word, each check bit comprising the dot product of a row of the first ECC code and a data word.

8. The system according to claim 1, wherein the first device includes an error injection circuit, the error injection circuit injecting a triple error into a nibble of the at least one codeword if the error status indicated an uncorrectable error.

9. The system according to claim 1, wherein the second device includes a syndrome processor, the syndrome processor receiving the at least one codeword and re-computing the check bits on the data using the second ECC code, the second device generating a syndrome by comparing the check bits in the at least one codeword with the re-computed check bits.

10. The system according to claim 9, wherein the syndrome comprises the dot product of the second ECC code AND each at least one codeword.

11. The system according to claim 9, further comprising an error classifier, the error classifier classifying errors in the received at least one codeword based on the syndrome.

12. The system according to claim 11, wherein the classification comprises one of no error, correctable error, and uncorrectable error.

13. The system according to claim 1, wherein the error status indicates one of no error, correctable error, and uncorrectable error.

14. The system according to claim 1, wherein the first ECC code comprises a matrix.

15. A method for propagating error status over an error checking and correcting (ECC) protected channel comprising:

receiving data and an error status associated with the data at a first device;

generating check bits for the data based on a first ECC code and combining the check bits with the data to form at least one codeword at the first device;

sending the at least one codeword across a channel, the first device inserting a triple error into a nibble of at least one codeword sent if the error status indicated an uncorrectable error; and receiving the at least one codeword sent across the channel by a second device, the second device detecting any triple errors within a nibble of the at least one codeword and any other single error in the at least one codeword using a second ECC code.

16. The method according to claim 15, wherein the other single error comprises an error introduced by the channel.

17. The method according to claim 15, further comprising placing the check bits in the at least one codeword to allow for single 4 bit nibble error detection (S4ED).

18. The method according to claim 15, wherein the second ECC code comprises the first ECC code with additional columns inserted denoting designated positions of check bits, the check bit positions providing for single 4 bit nibble error detection (S4ED).

19. The method according to claim 15, further comprising generating a check bit for each row of the first ECC code, the data comprising at least one data word, each check bit comprising the dot product of a row of the first ECC code and a data word.

20. The method according to claim 15, further comprising recomputing the check bits on the data using the second ECC code by the second device, the second device generating a syndrome by comparing the check bits in the at least one codeword with the re-computed check bits.

21. The method according to claim 20, wherein the syndrome comprises the dot product of the second ECC code AND each at least one codeword.

22. The method according to claim 20, further comprising using the syndrome to classify errors in the received at least one codeword.

23. The method according to claim 20, further comprising determining a weight of nibbles of the syndrome where the weight is the number of 1's in the syndrome, the classification being based on the weight.

24. The method according to claim 22, wherein the classification comprises one of no error, correctable error, and uncorrectable error.

25. The method according to claim 15, wherein the error status indicates one of no error, correctable error, and uncorrectable error.

26. An article comprising a storage medium containing instructions stored therein, the instructions when executed causing a processing device to perform:

receiving data and an error status associated with the data;

generating check bits for the data based on an ECC code and combining the check bits with the data to form at least one codeword; and sending the at least one codeword across a channel, the processing device inserting a triple error into a nibble of the at least one codeword sent if the error status indicated an uncorrectable error.

27. The article according to claim 26, wherein the error status indicates one of no error, correctable error, and uncorrectable error.

28. The article according to claim 26, wherein the ECC code comprises a matrix.

29. The article according to claim 26, wherein a check bit is generated for each row of the ECC code, the data comprising at least one data word, each check bit comprising the dot product of a row of the ECC code and a data word.

* * * * *

UNITED STATES PATENT AND TRADEMARK OFFICE
CERTIFICATE OF CORRECTION

PATENT NO. : 6,622,268 B2
DATED : September 16, 2003
INVENTOR(S) : Holman

It is certified that error appears in the above-identified patent and that said Letters Patent is hereby corrected as shown below:

Column 4,
Line 58, before "the present", insert -- illustrate --.
Line 61, after "columns", insert -- from the H-matrix you get --.
Line 67, delete "words", insert -- word --.

Column 5,
Line 4, delete "S4D", insert -- S4ED --.

Signed and Sealed this

Second Day of December, 2003

JAMES E. ROGAN
*Director of the United States Patent and Trademark Office*